United States Patent [19]

Takahata et al.

[11] 3,864,217

[45] Feb. 4, 1975

[54] METHOD OF FABRICATING A SEMICONDUCTOR DEVICE

[75] Inventors: Koichiro Takahata; Hiroshi Shiba, both of Tokyo, Japan

[73] Assignee: Nippon Electric Company, Limited, Tokyo, Japan

[22] Filed: Jan. 21, 1974

[21] Appl. No.: 434,259

[52] U.S. Cl. .................. 204/15, 317/234 L, 29/590

[51] Int. Cl. .................................................. C23b 5/48

[58] Field of Search....... 204/15; 317/234 L; 29/590

[56] References Cited

UNITED STATES PATENTS

| | | | |
|---|---|---|---|
| 3,741,880 | 6/1973 | Shiba et al. | 204/15 |
| 3,774,079 | 11/1973 | Zechman | 317/234 R |
| 3,798,135 | 3/1974 | Bracken et al. | 317/234 R |

*Primary Examiner*—T. M. Tufariello
*Attorney, Agent, or Firm*—Hopgood, Calimafde, Kalil, Blaustein & Lieberman

[57] ABSTRACT

A method of fabricating a semiconductor device is disclosed, in which an insulating film is formed on one main surface of a semiconductor substrate and a plurality of openings are formed in the insulating film to permit connnection to the substrate surface. Thereafter, a thin film of the same semiconductor material as the material of the semiconductor substrate is deposited on the insulating film and on the exposed areas of the substrate surface. A metallic film is then deposited over the thin film of semiconductor material. The metallic film and the semiconductor thin film are then selectively converted to their respective oxides, through an anodic oxidation process to form insulating regions between the interconnections in said device. Thereafter, those portions of the metallic film and the semiconductor thin film which have not been converted to their oxides are alloyed with each other by heating the device to form the interconnections and ohmic contacts in the semiconductor device. In an alternative embodiment of the invention, the heating process is carried out prior to the process of selective anodic oxidation with an equally satisfactory result.

8 Claims, 20 Drawing Figures

METHOD OF FABRICATING A SEMICONDUCTOR DEVICE

BACKGROUND OF THE INVENTION

The present invention relates in general to a method of fabricating semiconductor devices, and more particularly, to a method of forming electrodes or interconnections in a semiconductor device having a shallow junction.

Heretofore, aluminium has been generally used as a material for forming electrodes or interconnections in semiconductor devices, however, aluminum may react with semicondutor materials at relatively low temperatures to form alloys. If the alloy region thus formed penetrates a P-N junction of the device, that junction will be destroyed. In devices having extremely shallow junctions such as, for example, ultra-high speed switching transistors and semiconductor devices having a so-called "washed emitter"structure in which the diffusion openings and the electrode lead-out openings are the same, this problem is especially acute. Consequently, conventional semiconductor devices employing aluminum for electrodes or interconnections tend to be thermally very unstable in such devices.

Therefore, it is an object of the present invention to provide a novel method of fabricating a thermally stable semiconductor device.

Another object of the present invention is to provide a method of fabricating, through a simple process, a semiconductor device that is chemically and mechanically stable and thus has very high reliability.

According to the present invention, electrodes and interconnections of a semiconductor device are formed by alloying a thin film of the same semiconductor material as the semiconductor substrate and a metallic film which is deposited on the semiconductor thin film. The thickness of the semiconductor thin film is chosen so that after heat treatment most of the semiconductor film will be diffused into the metallic film. In such an arrangement, an ohmic contact between the electrodes or interconnections so formed and the semiconductor substrate may be attained by heating the substrate to an appropriate temperature.

In the following description, for the sake of convenience, examples are shown with respect to the materials which are most widely used at present, that is, silicon as the semiconductor material and aluminum as the electrode or interconnection metal. However, as will be apparent to those skilled in the art, other materials can be substituted.

It has been generally known that the main cause of junction destruction during an alloying reaction between a silicon substrate and an aluminum electrode is in the fact that when silicon and aluminum are heated, or sintered, at temperatures such as 350° to 600°C at which an alloying reaction will occur therebetween a little silicon from the exposed areas of the substrate in the lead-out opening regions can be diffused into the aluminum resulting in a junction being short-circuited by the formation of an area of Al-Si alloy. Methods for preventing such junction short-circuiting, heretofore proposed are;

a. a method in which an Al-Si alloy is deposited on the substrate by evaporation to form an aluminum silicide electrode or interconnection layer, b. a method in which electrodes or interconnections comprise a double layer structure consisting of a barrier layer made of high melting point metal such as nickle, tantalum or titanium and a conductive layer of aluminum. The diffusion of silicon from the substrate into the aluminum is then prevented by the barrier layer, and c. a method in which aluminum is not used for electrodes or interconnections, but instead a multi-layer structure mainly consisting of, for example, gold, silver, and the like is employed.

all these prior art methods have disadvantages in that the method of manufacture becomes too complex, and the resulting ohmic contact resistance is either too high or has too broad a distribution of nominal values.

SUMMARY OF THE INVENTION

The present invention provides a method for fabricating a semiconductor device which device includes a semiconductor substrate of a given semiconductor material and a film of insulating material covering at least one major surface of said substrate including the steps of: forming openings through said insulating film to expose portions of said major surface of said substrate; forming a thin film of said given semiconductor material over said insulating layer and said exposed portions of said substrate; forming a metallic film over said thin film of semiconductor material; selectively converting at least a portion of the material of said metallic film and the material of said semiconductor thin film into the respective oxides of said materials by anodic oxidation; and heating the semiconductor device to alloy at least a portion of said metallic film with said semiconductor thin film. The method of the present invention is also applicable to the production of multi-layer interconnection structures.

Other features and advantages of the present invention will become more apparent from the following description of embodiments taken in connection with the accompanying drawings, in which:

DESCRIPTION OF THE DRAWINGS

In these figures, the same or similar parts are represented by the same reference numerals.

DESCRIPTION OF THE INVENTION

Figure 1A:
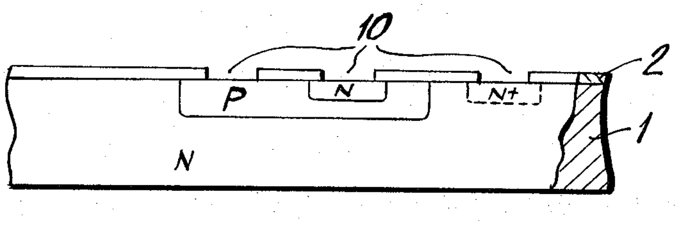
FIGS. 1*a* through 1*g* are cross-sectional views of a semiconductor device showing the successive steps in the method of fabrication of a semiconductor device according to one preferred embodiment of the present invention.
Figure 1B:
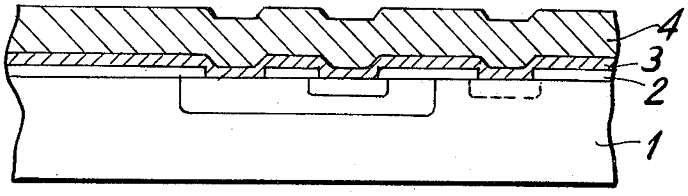
Figure 1C:
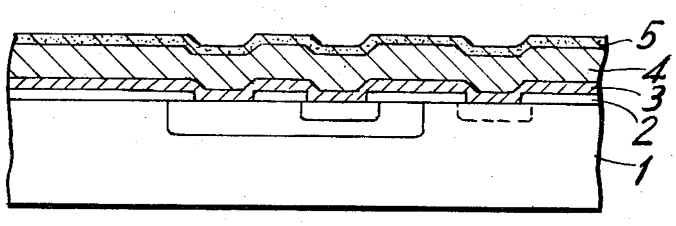
Figure 1D:
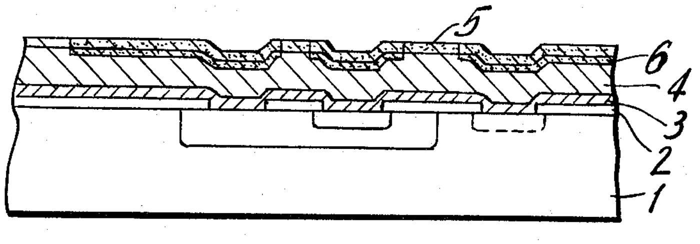
Figure 1E:
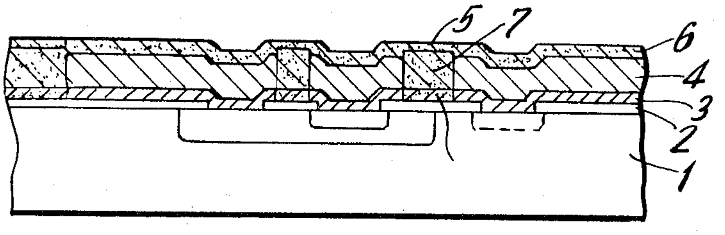
Figure 1F:
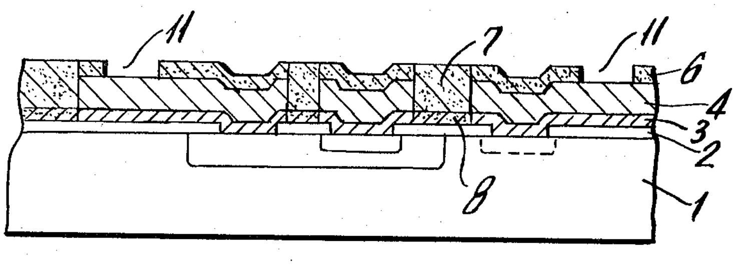
Figure 1G:
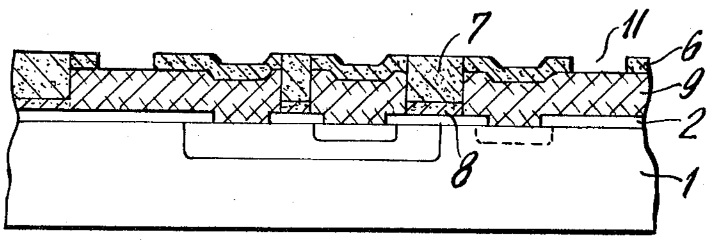

Referring now to FIGS. 1 *a* to 1*g* of the drawings, the method of fabricating a semiconductor device according to a preferred embodiment of the present invention utilizes a selective anodic oxidation process. A silicon semiconductor substrate 1 having predetermined P-N junctions therein which is covered with a silicon oxide film 2 is prepared. In the silicon oxide film 2, openings 10 are formed to expose selected regions of the semiconductor substrate 1 to which electrodes are to be attached. The openings 10 are formed by selectively removing the silicon oxide film through the well known phot-etching technique, to provide a device as shown in FIG. 1*a* . Then a thin film 3 of silicon having a uniform thickness of 100 angstroms is deposited on the semiconductor substrate 1 by evaporation, and subsequently in the same evacuation cycle an aluminum film 4 of 1.5 microns in thickness is also deposited to provide a device by evaporation, as shown in FIG. 1 *b*. A porous alumina film 5 of about 0.1 micron in thickness is then formed by a first anodic oxidation process over the entire surface of the aluminum film 4, as shown in FIG. 1*c*. This porous alumina film 5 is useful for precisely defining the boundaries of electrodes or interconnections and also for enhancing the adhesiveness of the photo-resist which is used in the subsequent selective anodic oxidation process. The first anodic oxidation process is preferably carried out by using a constant voltage anodization at an anodization voltage of 10V for 10 minutes employing a 10 % chromic acid aqueous solution and utilizing the aluminum film 4 and/or the substrate 1 as an anode. This anodic oxidation process converts the surface of the aluminum film 4 into the alumina film 5. A photo-resist which is not shown is then applied to the surface of the alumina film 5 so that it covers all portions of the aluminum film 4 except those that are to become electrodes a second selective anodic oxidation process is then carried out on the aluminum film 4 employing the photo-resist as a mask. Those portions of the surface of the aluminum film 4 which were not covered by the photo-resist are converted into a film of non-porous alumina 6, underlying film 5 as shown in FIG. 1 *d* . For this second anodic oxidation, preferably a constant voltage anodization is carried out at an anodization voltage of 80V for 15 minutes employing an electrolyte consisting of ethylene glycol saturated with ammonium borate. Subsequently, after the photo-resist has been removed, a third selective anodic oxidation is carried out using the non-porous alumina film 6 as a mask, to convert those portions of the aluminum film 4 and the silicon thin film film 3 which are not covered by non-porous alumina film 6 into a porous alumina film 7 and a silicon oxide film 8, respectively, as shown in FIG. 1 *e* . For the third anodic oxidation, preferably a constant voltage anodization is conducted at an anodization voltage of 10V employing 10% dilute sulfuric acid at a temperature of 25°C as an electrolyte. In this embodiment, conversion into the alumina film 7 and the silicon oxide film 8 is completed in about 10 minutes. External lead-out openings 11 are formed at desired portions in the alumina film 6, as shown in FIG. 1 *f*. Finally, through a heat treatment, that is, sintering in a nitrogen atmosphere for about 30 minutes at a temperature of 450°C, the formation of electrodes 9 is completed. By this sintering, most of the silicon thin film 3 and the aluminum film 4 is converted into aluminum-silicon alloy 9, as shown in FIG. 1 *g*, to prevent mutual diffusion between the silicon substrate and the aluminum electrode to provide a good ohmic contact to the silicon substrate 1. By this sintering process the various oxide films 5, 6, 7, and 8 which were made by the anodic oxidation processes, are stabilized.

The method of fabricating a semiconductor device according to the above-described embodiment of the present invention is different from the prior art method only in that the silicon thin film 3 is formed on the substrate prior to the step of depositing an aluminum film 4 by evaporation. In a semiconductor device fabricated by the above described method, the silicon of the substrate 1 will not be diffused into the electrodes 9 formed of aluminum-silicon alloy even during subsequent heat treatments which are generally at a temperature lower than the sintering temperature, because the aluminum-silicon alloy of the electrodes 9 is already saturated with silicon. In this way, the P-N junctions are protected from destruction and are rendered thermally very stable. In addition, since the surface of the silicon substrate is entirely covered by the materials of the electrodes and by oxides of those materials, the semiconductor device is protected from external contamination, and hence extremly stable electric performances can be attained by devices manufactured by this process.

A further advantage of the present invention lies in the fact that since the metal of the electrodes itself is protected by a chemically stable oxide, the electrodes are mechanically and chemically stable to provide a semiconductor device having a very high reliability jointly with the aforementioned thermal and electrical stabilities.

Moreover, the presence of the underlying silicon film 3 provides another advantage with respect to the prior art technique of selective anodic oxidation. In the conventional technique of selective aluminum anodization non-anodized aluminum often remains in the anodized portions in the form of dots or in form of a line along a step formation in the underlying oxide film. Therefore, there has been a danger that the insulation between adjacent electrodes or interconnections might be degraded. It has also been impossible to make the interval between adjacent electrodes or interconnections in a device as short as 4 microns where a step formation in the underlying oxide film is included within the interval. According to the present invention, since an anodization current can be supplied to any portion of the aluminum film 4 through the underlying silicon film 3 from the substrate 1 till the selective anodization of the aluminum film 4 is completed across its entire thickness, no non-anodized aluminum remains in the anodized portions. This eliminates the problem of degration of the insulation between electrodes or interconnections, and it is possible to form a finer pattern of electrodes or interconnections which, for example, have intervals of 4 microns between adjacent electrodes even where a step is present in the underlying oxide film.

While the silicon thin film is deposited by evaporation in the above-described embodiment, it can be deposited on the substrate by other techniques such as sputtering or chemical vapor deposition. Also, while the non-porous alumina film 6 formed on the surface of the aluminum film 4 is used as a mask for anodic oxidation of the aluminum film 4 and the silicon thin film 3 in the above-described embodiment, other suitable masks such as a photo-resist can be used.

If the silicon film 3 is formed by vapor deposition of sputtering the resulting film seems to be polycrystalline silicon, or more precisely, amorphous silicon. The thickness of the silicon thin film 3 formed by vapor deposition or sputtering may be 10 to 1,000 angstroms, preferably 10 to 600 angstroms and most preferably 30 to 400 angstroms. If the film 3 is formed by a chemical vapor deposition process, it is desirable to make it somewhat thinner, for instance, less than 100 angstroms. The aluminum film 4 may have a thickness of more than 0.5 micron, and preferably 1 micron or more. A practical thickness of aluminum film 4 is 1 to 1.7 micron. The sintering temperature is normally 400 to 500°C. The aluminum film after sintering need not be uniformly alloyed with silicon throughout. As long as at least the lower portion of the aluminum film 4 is alloyed with silicon, the upper part of the aluminum film 4 may remain non-alloyed. As described in the aforementioned embodiment, the silicon thin film 3 can be converted into oxide in the same step as the anodic oxidation of the aluminum film 4. If desired, an anodic oxidation for silicon may be carried out separately from the oxidation of aluminum.

While in the aforementioned embodiment external lead wires are connected to the electrodes 9 through the openings 11, one or more layers of interconnections may be formed over the surface of alumina film 5, with electrical connections to the electrodes 9 through the openings 11. Such additional layer or layers of interconnections may be produced by an anodic oxidation process employing another aluminum layer or a double layer consisting of silicon and aluminum or of tantalum and aluminum. Also, if desired, a layer of gold or other metals may be formed on the upper surface of the electrodes or interconnections covering them either entirely or partially.

Figure 2A:
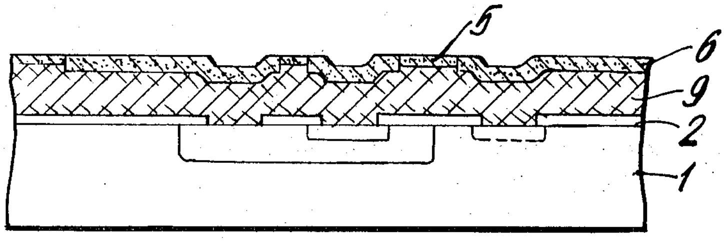
FIGS. 2*a* and 2*b* are cross-sectional views of devices showing alternative steps which replace some of the steps shown in FIGS. 1*a* through 1*g* to provide another embodiment of the present invention.
Figure 2B:
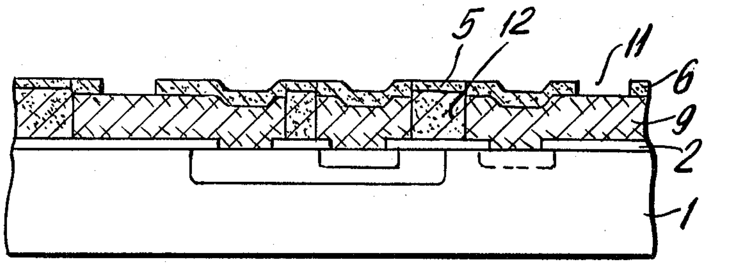

Now additional modified embodiments of the present invention will be described with reference to FIGS. 2*a*and 2*b*, FIGS. 3*a*and 3*b*, and FIGS. 4*a*and 4*b*. While the sintering is performed after completion of the anodic oxidation according to the above described first embodiment, this sequence of steps can be reversed without any disadvantage. The sintering may be carried out before th anodic oxidation, that is, before or immediately after the formation of the mask for anodic oxidation such as for instance, subsequently to the step shown in either FIG. 1*b* or in FIG. 1*d*, to form an alloyed layer 9 consisting of silicon-aluminum alloy such as that shown in the device FIG. 2*a*. Thereafter, an anodic oxidation of the layer 9 is carried out, producing a device as shown in FIG. 2*b*, resulting in an equally excellent semiconductor device. In this case, the anodized film 12 into which a part of the layer 9 is converted consists of alumina and silicon oxide.

Figure 3A:
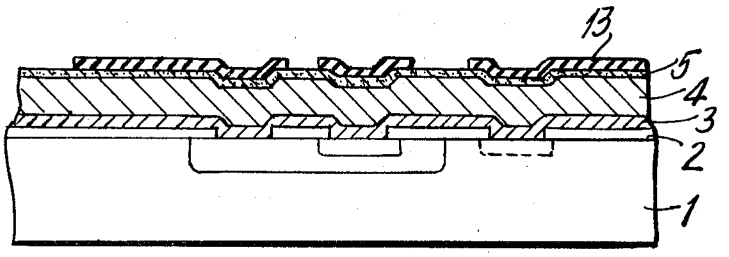
FIG. 3*a* and 3*b* are cross-sectional views of devices illustrating alternative steps which replace some of the steps illustrated in FIGS. 1*a* through 1*g* to provide a third embodiment of the present invention.
Figure 3B:
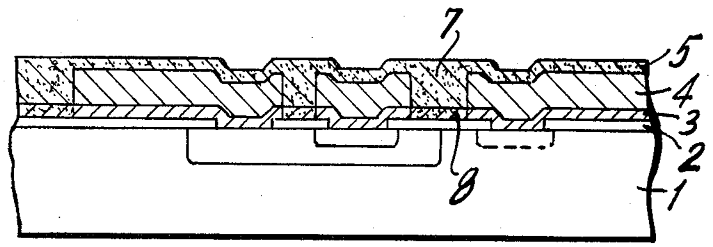
Figure 4A:
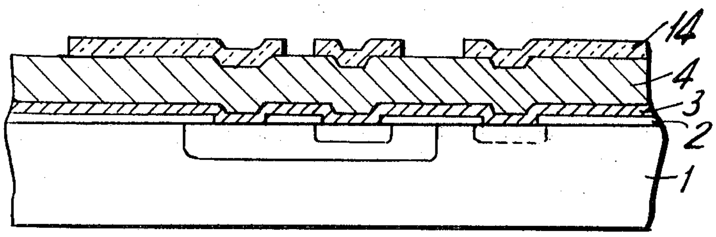
FIGS. 4*a* and 4*b* are cross-sectional views illustraing alternative steps which replace some of the steps shown in FIGS. 1*a* through 1*b* to provide a fourth embodiment of the present invention.
Figure 4B:
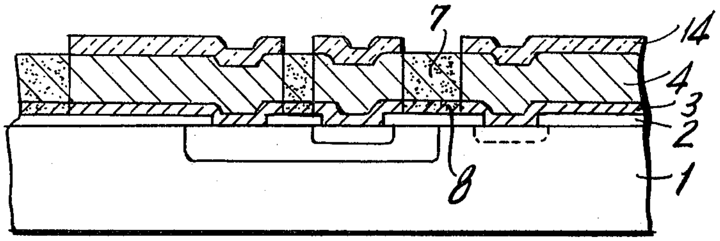

While the selective anodic oxidation of the aluminum film and the silicon film is carried out utilizing the non-porous alumina film 6 as a mask in the above-described embodiments, it can be conducted in a different manner. For instance, after the step shown in FIG. 1*c*, a mask 13 pf photo-resist can be applied to the surface of the alumina film 5, as shown in FIG. 3*a*, to mask those portions to be retained as electrodes. Then, an anodic oxidation is carried out employing this mask 13 so that an alumina film 7 and a silicon oxide film 8, are formed as shown in FIG. 3*b*. Alternatively, after the step shown in FIG. 1*b*, a mask 14 of an insulating material such as silicon oxide, glass, or the like or metal such as titanium, tantalum, or the like can be deposited on the surface of those portions of the aluminum film 4 which are to be retained as electrodes, as shown in FIG. 4*a*. An alumina film 7 and a silicon oxide film 8 can then be obtained by carrying out anodic oxidation employing this mask 14, as shown in FIG. 4*b*.

In the above embodiments, only a single transistor is formed in the semiconductor substrate 1 and the electrodes 9 for this transistor are illustrated. However, a plurality of transistors which are isolated from each other may be included in a common substrate 1 and interconnections for these transistors may be formed in the same manner as the electrodes 9 are formed in the above embodiments.

Figure 5A:
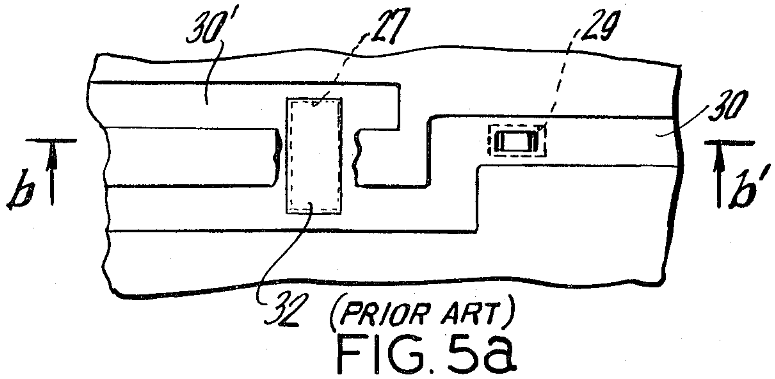
(PRIOR ART) FIG. 5a
FIG. 5*a* is a plane view of a conventional semiconductor device having a multi-layer interconnection structure fabricated through the selective anodic oxidation technique.
Figure 5B:
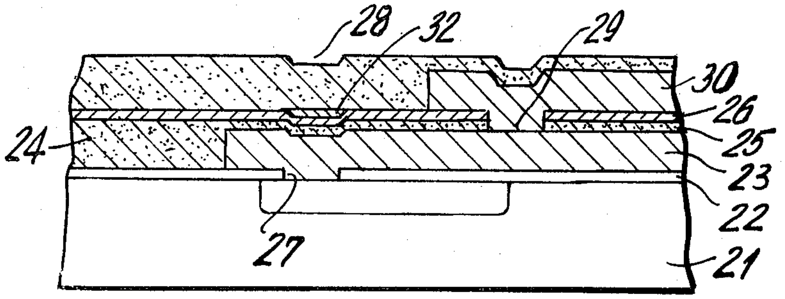
(PRIOR ART) FIG. 5b
FIG. 5*b* is a cross-sectional view taken along the line *b–b'* of FIG. 5*a*.

Now referring to FIGS. 5 through 7, other embodiments of the present invention will be described which are concerned with the fabrication of a multi-layer interconnection structure. In a prior art method, as shown in FIG. 5, when a second layer interconnection 30 is formed selective aluminum anodization, some aluminum 32 remains unanodized at a hollow 28 which is formed due to the presence of contact opening 27 lying beneath it. This unanodized aluminum causes short-circuiting of adjacent interconnections 30 and 30'of the second layer.

Figure 6A:
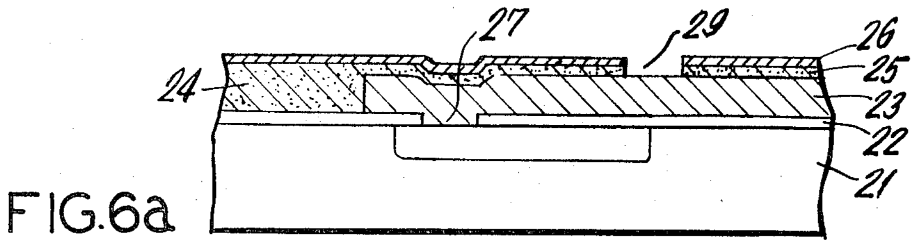
FIGS. 6*a* through 6*d* are cross-sectional views showing the successive steps to fabricate a multi-layer interconnection structure according to the method of the present invention.
Figure 6B:
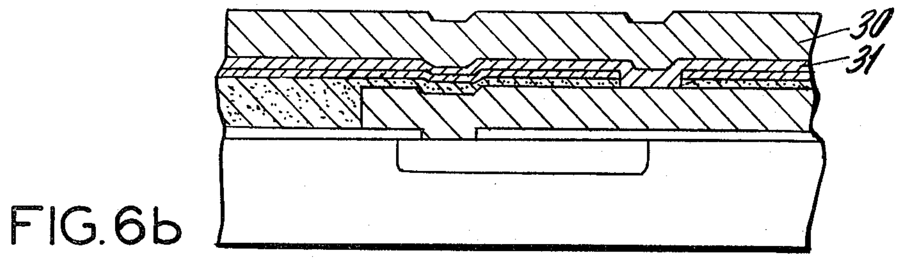
Figure 6C:
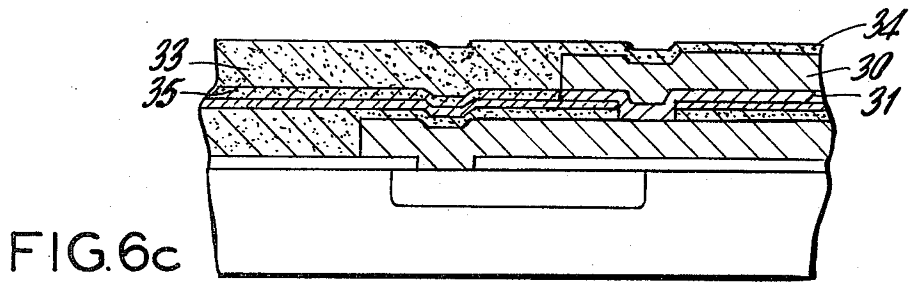
Figure 6D:
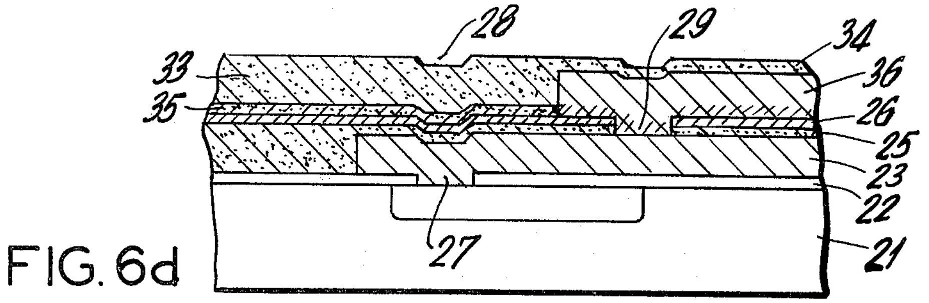
Figure 7:
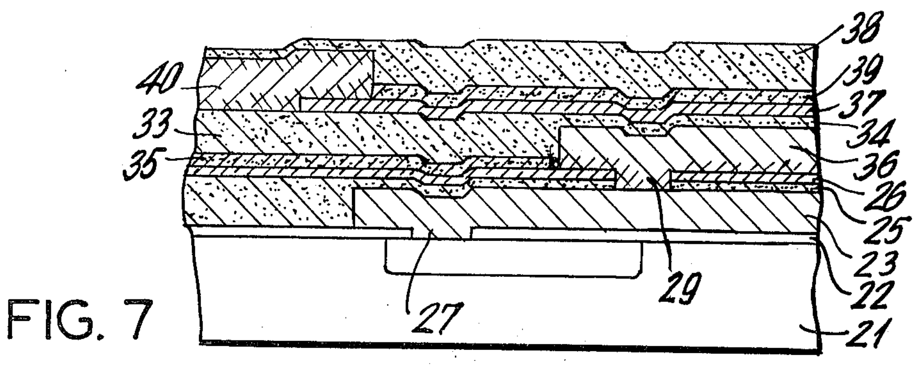
FIG. 7 is a cross-sectional view of another example of a multi-layer interconnection structure fabricated according to the method of the invention.

According to an embodiment of the present invention as shown in FIG. 6*a* a first layer interconnection 23 is at first formed on a semiconductor substrate 21 having a plurality of circuit elements formed therein and covered with an insulator film 22. The insulator film 22 is in turn provided with contact openings 27. The first layer 23 is formed by selective aluminum anodization and the layer 23 is partially covered by an alumina layer 24. The surface of the first interconnection layer 23 of aluminum is also covered with an alumina film 25. Such first interconnection may be formed by the same method as used in any of the aforementioned embodiments shown in FIGS. 1 to 4. Then, a silicon oxide film 26 is deposited by chemical vapor deposition over the alumina films 24 and 25. A contact opening 29 is formed to expose a part of the surface of the first interconnection layer of aluminum 23, as shown in FIG. 6*a*. Thereafter, a thin film 31 of amorphous or polycrystalline silicon, as shown in FIG. 6*b*, having a thickness of about 200 angstroms and a conductivity type of either p-or n- type is deposited over the silicon oxide film 26 and into the contact opening 29, by the electron beam evaporation technique or the chemical vapor deposition technique. An aluminum layer 30 of about 1.5 micron in thickness is deposited over the silicon film 31 by the electron beam evaporation technique. Then, anodic oxidation is carried out in the same manner as heretofore illustrated with reference to FIGS. 1*b* to 1*e*, FIGS. 2*a* to 2*b*, FIGS. 3*a* to 3*b*, or FIGS. 4*a* to 4*b*, to convert the undesired portions of the aluminum layer 30 and silicon film 31 into alumina layer 33 and silicon oxide film 35, respectively as shown in FIG. 6*c*. Then, heat treatment (or sintering) is carried out at 350° to 550°C in nitrogen for about 1 hour. As a result, the silicon film 31 reacts with an diffuses into the aluminum layer 30 to form a second interconnection layer of silicon-aluminum alloy 36, as shown in FIG. 6*d*. At the same time, a good ohmic contact is secured between the first interconnection layer 23 and the second interconnection layer 36 at the through hole 29. Alternatively the heat treatment may be performed before the anodic oxidation, as described with reference to FIGS. 2*a* and 2*b*. Moreover, where the first interconnection layer 23 is formed by use of silicon and aluminum films as in the first embodiment shown in FIG. 1, a single, common heat treatment may be performed for both of the first and second interconnection layers. Incidentally, a tantalum film may be used instead of the silicon film 31.

According to the present invention, no aluminum remains in a hollow 28, because the underlying silicon film 31 supplies an anodization current there. In the similar way as in the embodiment shown in FIGS. 6*a* to 6*d*, a third interconnection layer 40 as shown in FIG. 7 and still further interconnection layers may be formed in this way.

To form the third interconnection layer 40 an insulting layer 37 is formed over alumina layer 36. A semiconductor layer is then formed over layer 37 and extends through apertures in the semiconductor and alumina layers, which are not shown in FIG. 7, to cover a portion of the underlying interconnection layer. A layer of metal is then formed over the semiconductor layer. The semiconductor and metallic layers are then selectively converted to their oxides by anodic oxidation to form respectively the layers 39 and 38. By heating the device the unoxidized portions of the semiconductor layer are at least partially alloyed with the unoxidized portions of the aluminum layer to form the interconnection layer 40.

While the present invention has been described above in connection to its preferred embodiments, the scope of the present invention should not be limited to the above-describerd embodiments but rather should cover the entire scope as defined in the appended claims.

What is claimed is:

1. A method of fabricating a semiconductor device which device includes a semiconductor substrate and an insulating film covering at least one major surface of said substrate including the steps of:

forming openings in said insulating film to expose portions of said major surface of said substrate;

forming a thin film of the same semiconductor material as said substrate over said insulating layer and said exposed portions of said substrate;

forming a metallic film over said thin film of semiconductor meterial;

selectively converting at least a portion of the material of said metallic film and said semiconductor thin film into the oxides of their respective materials by anodic oxidation; and heating said device to alloy at least a portion of said metallic film with said semiconductor thin film.

2. A method as claimed in claim 1 in which portions of the materials of said metallic film and said thin film are selectively converted into their respective oxides by the following additional steps:

forming a porous alumina film over said metallic film by a first anodic oxidation process;

forming a mask over selected portions of the surface of said metallic film, said mask having apertures in selected areas to expose portions of the surface of said metallic film; and converting those portions of said metallic film and said semiconductor film underlying said exposed surface portions into their respective oxides by a second oxidation process.

3. A method as claimed in claim 1 in which portions of said metallic film and said semiconductor thin film ar selectively converted into their respective oxides by the following additional steps:

forming a porous alumina film over said metallic film by a first anodic oxidation process;

forming a mask over selected portions of the surface of said metallic film, said mask having apertures in selected areas;

forming non-porous alumina layers underlying said apertures by a second anodic oxidation process;

removing said mask; and converting those areas of said metallic film and said semiconductor film lying beneath surface areas which had been covered by said mask into their respective oxides by a third anodic oxidation process.

4. A method as claimed in claim 1 in which said thin film of the same material as said substrate is deposited on said insulating layer and said exposed areas of said substrate to form a film of 10 to 1,000 angstroms in thickness and in which a metal is deposited on said thin film to form a metallic layer of at least 0.5 microns in thickness.

5. A method of fabricating a semiconductor device which device includes a semiconductor substrate and an insulating film covering at least one major surface of said substrate including the steps of:

forming openings in said insulating film to expose portions of said major surface of said substrate;

forming a thin film of the same semiconductor material as said substrate over said insulating layer and the said exposed portions of said substrate;

forming a metallic film over said thin film of semiconductor material;

heating said device to alloy at least a portion of said metallic film with said semiconductor to form an alloyed film; and selectively converting at least a portion of said alloyed film into an insulator by anodic oxidation.

6. A method of fabricating an interconnecting structure for a semiconductor device which device includes a surface to which connection is to be made including the steps of:

forming at least one insulating layer over said surface;

forming apertures in said at least one insulating layer to expose portions of said surface;

forming a layer of semiconductor material over said at least one insulating layer and exposed portions of said surface;

forming a metallic layer over said layer of semiconductor material;

selectively converting at least a portion of material of said metallic layer and said semiconductor layer into the oxides of their respective materials by anodic oxidation; and heating said device to alloy at least a portion of said metallic layer and said semiconductor layer.

7. A method as claimed in claim 6 wherein said at least one insulating layer is formed by the steps of:

forming an insulating alumina layer over said surface;

depositing a silicon oxide film over said alumina layer; and forming apertures through both said alumina layer and said silicon oxide layer to expose portions of said surface.

8. A method as claimed in claim 7 wherein said layer of semiconductor material is formed by depositing a thin film of silicon having a thickness of about 200 angstroms over said silicon oxide layer and the exposed portions of said surface and wherein said metallic layer is formed by depositing an aluminum layer of about 1.5 microns in thickness over said thin film of silicon.

* * * * *

UNITED STATES PATENT OFFICE
CERTIFICATE OF CORRECTION

Patent No. 3,864,217 Dated February 4, 1975

Inventor(s) TAKAHATA et al

It is certified that error appears in the above-identified patent and that said Letters Patent are hereby corrected as shown below:

Claim 3, Column 8, Line 13 - --ar-- should be --are--

Claim 5, Column 8, Line 47 - after "semiconductor" insert --thin film--

Signed and sealed this 29th day of April 1975.

(SEAL)
Attest:

RUTH C. MASON
Attesting Officer

C. MARSHALL DANN
Commissioner of Patents
and Trademarks